(12) United States Patent
Howe (10) Patent No.: US 11,689,196 B1
(45) Date of Patent: Jun. 27, 2023

(54) SOLID STATE RELAY HARVESTING POWER FROM LOAD BY MEASURING ZERO CROSSING

(71) Applicant: Littelfuse, Inc., Chicago, IL (US)

(72) Inventor: Bret R. Howe, Irvine, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/735,629

(22) Filed: May 3, 2022

(51) Int. Cl.
  *H03K 17/13* (2006.01)
  *H03K 3/037* (2006.01)
  *H03K 19/20* (2006.01)

(52) U.S. Cl.
  CPC ............. *H03K 17/13* (2013.01); *H03K 3/037* (2013.01); *H03K 19/20* (2013.01)

(58) Field of Classification Search
  CPC ............... H03K 17/785; H03K 17/689; H03K 17/6874; H03K 17/567
  USPC ........................................................ 327/427
  See application file for complete search history.

(56) References Cited

U.S. PATENT DOCUMENTS

| 5,903,139 A * | 5/1999 | Kompelien ........... H02M 5/293 327/537 |
| 8,704,409 B2 * | 4/2014 | Owens ................. H03K 17/785 307/125 |
| 2010/0231055 A1 * | 9/2010 | Black ....................... H03K 3/00 307/125 |
| 2022/0329168 A1 * | 10/2022 | Narayanasamy ...... H03K 17/76 |

OTHER PUBLICATIONS

"Isolated Self-Powered AC Solid-State Relay With MOSFETs" Texas Instruments Design Brochure—Jan. 2017.

* cited by examiner

*Primary Examiner* — Quan Tra
(74) *Attorney, Agent, or Firm* — KDW Firm PLLC (57) ABSTRACT

A relay circuit, including a solid state relay switch, connected to a first relay line and to a charging capacitor, and connected to a second relay line. The relay circuit may also include a solid state relay control circuit, coupled between the charging capacitor and the solid state relay switch. The solid state relay control circuit may include a voltage detection circuit, having an input coupled to an output of the charging capacitor, and having an output arranged to generate a LOW voltage signal when a voltage level of the charging capacitor is below a low threshold value. The solid state relay control circuit may also include a zero crossing circuit, coupled to the first relay line and the second relay line, and having an output to generate a clock signal when a zero crossing event takes place between the first relay line and the second relay line.

14 Claims, 7 Drawing Sheets

SOLID STATE RELAY HARVESTING POWER FROM LOAD BY MEASURING ZERO CROSSING

BACKGROUND

Field

Embodiments relate to the field solid state relays, and more particularly to relay circuits that are chargeable when a relay is in an off state.

Discussion of Related Art

Relays, including solid state relays (SSR) are switches that may be electrically operated. Such relays may operate in powercontrol circuits designed where it is necessary to control a circuit by an independent low-power signal, for example. As such, a powercontrol circuit including a relay may itself derive power from a source, such as a battery. For convenience, power control circuits have been designed that derive power for the relay from a load that is externally coupled to the relay.

One known approach to a load-powered relay is to charge a supply capacitor in the power control circuit to a DC voltage using the load voltage when the relay is off. In this known approach, when the relay is turned on and the capacitor drops to a low level, the relay is automatically turned off for a fixed amount of time to enable the capacitor to recharge. One concern for switching off the capacitor for a fixed time is that the time required for charging the capacitor may not always be well known. For example, the time required to charge the supply capacitor may depend upon, among other factors: 1) The load inductance; 2) The size of the capacitor; 3) The amount of current flowing in the inductor at the time the relay is turned off; 4) Load series resistance; and 5) The amount of load current being taken from the capacitor.

Thus, the turning off a relay for a fixed time may result under some circumstances in turning off the relay for too little time, in which case the capacitor does not charge completely; where turning off the relay for too much time will result in the load being disconnected for more time than necessary.

Moreover, if the load current is too high when the relay is switched off, the load voltage may spike to a very high level, causing protection components such as a transient voltage suppressor (TVS) to trigger. The repeated spiking of voltage will thus place stress on the TVS device and cause undue circuit noise and emissions.

With respect to this and other considerations the present disclosure is provided.

BRIEF SUMMARY

In one embodiment a relay circuit is provided. The relay circuit may include a solid state relay switch, connected to a first relay line for coupling to an external voltage line and to a charging capacitor, and connected to a second relay line for coupling to an external device. The relay circuit may also include a solid state relay control circuit, coupled between the charging capacitor and the solid state relay switch. The solid state relay control circuit may include a voltage detection circuit, having an input coupled to an output of the charging capacitor, and having an output arranged to generate a LOW voltage signal when a voltage level of the charging capacitor is below a low threshold value. The solid state relay control circuit may also include a zero crossing circuit, coupled to the first relay line and the second relay line, and having an output to generate a clock signal when a zero crossing event takes place between the first relay line and the second relay line.

In a further embodiment, a method is provided. The method may include providing a solid state relay switch having a first end coupled via a first relay line to a charging capacitor and to an external device line, and having a second end coupled over a second relay line to the charging capacitor and to an external load line. The method may also include receiving at the solid state relay switch, an ON signal based upon an enable high signal generated over an enable line from an external load device; and setting the solid state relay switch to an ON state when a capacitor voltage of the charging capacitor is above a high threshold value. The method may further include, when the capacitor voltage falls below a low threshold value, setting the solid state relay switch to an OFF state in response to receipt of a clock signal from a zero crossing circuit that is coupled to the first relay line and the second relay line.

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments present a novel approach to providing power from a load (harvesting power) for a relay circuit. According to embodiments a relay circuit is provided that optimizes performance by regulating when to draw power from a load for internal power needs. In various embodiments, a solid state relay switch is provided that is coupled to an external voltage line and to an charging capacitor. The solid state relay may use a control circuit to regulate a solid state relay switch so that the solid state relay switch automatically turned off when the voltage of the charging capacitor drops below a threshold value, and is automatically returned to an ON state when the voltage on the charging capacitor increases to reach a high threshold value. In addition, as detailed below, the changing of the solid state relay switch from an ON state to an OFF state may be performed in a manner to automatically ensure that the external load current during the turning off is at a relatively low level.

Figure 1A:
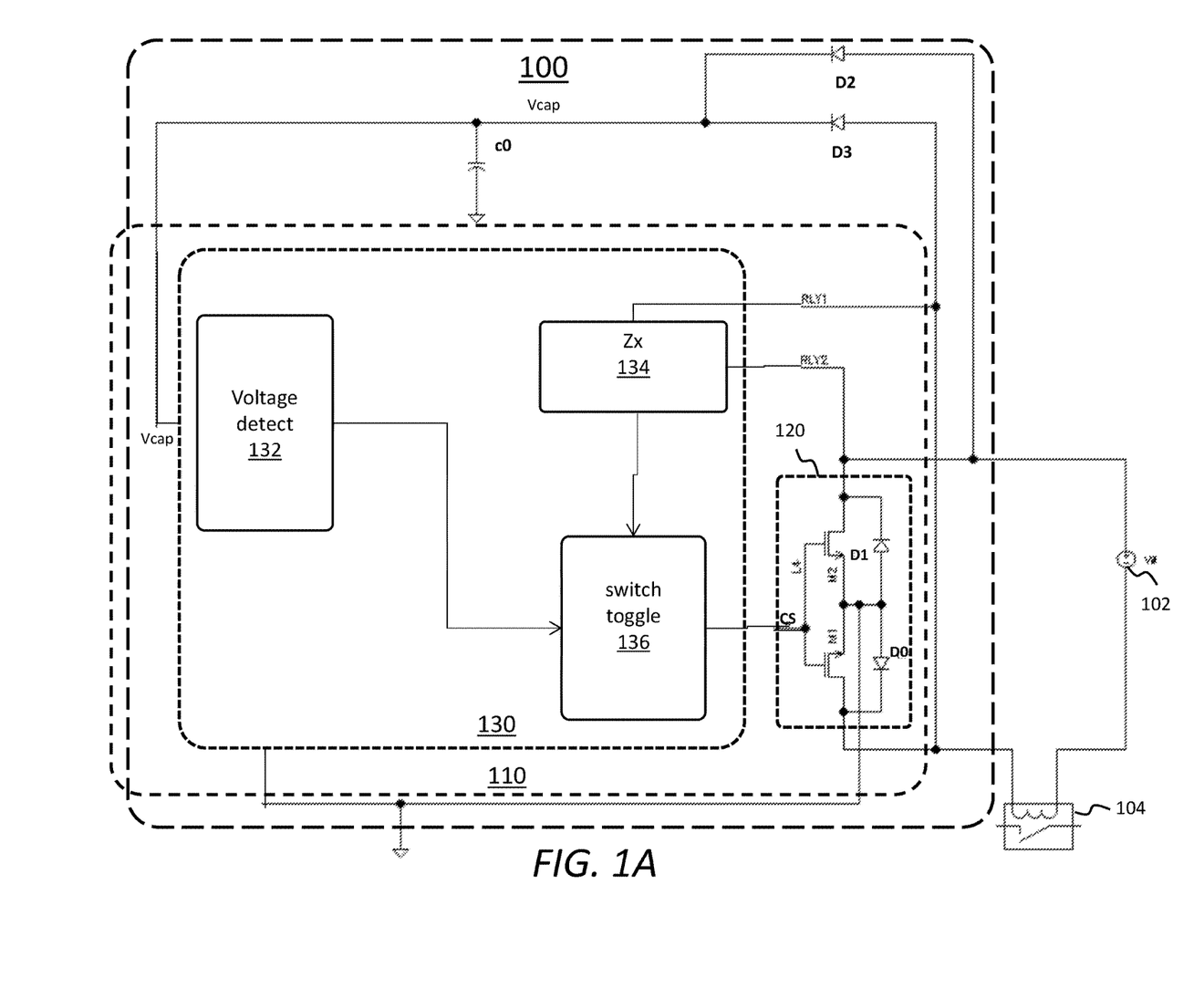
FIG. 1A, illustrates one embodiment of a power control circuit.
Figure 1B:
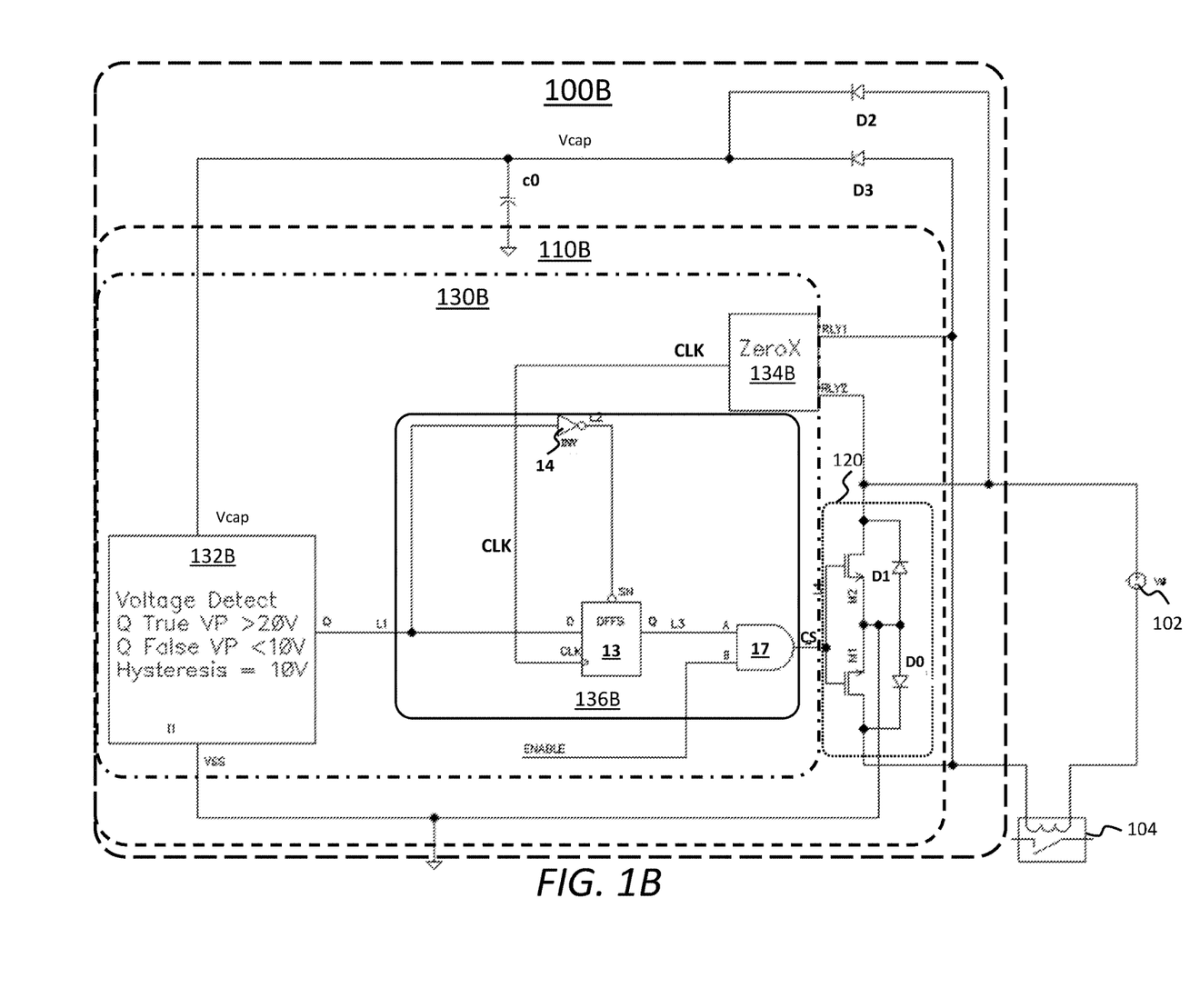
FIG. 1B illustrates another embodiment of another power control circuit.

FIG. 1A, illustrates one embodiment of a power control circuit. In this embodiment of the disclosure, a power control circuit 100 is depicted, in conjunction with an external power source, shown as power source 102, and an external relay, shown as relay 104. In the example shown, the relay 104 is coupled to the power source 102, which may supply a voltage in the form of an AC source. FIG. 1B illustrates another embodiment of a power control circuit, which circuit may be deemed a variant of the power control circuit 100. In operation, the power control circuit 100 will provide a relay function to enable a solid state relay circuit 110. Application of the power control circuit 100 include for regulation of power devices such as an air conditioner or heater, which devices may be regulated using a thermostat. In known applications, a thermostat for regulating a heater or air conditioner may be powered by a power source, such as a battery. In the present embodiments, components of the power control circuit 100 are configured to operate based upon power derived from an external load (such as power source 102 and relay 104), via a charging capacitor, shown as capacitor C0.

As shown in FIG. 1A the power control circuit 100 includes, in addition to the capacitor C0, a diode D3 and diode D2, and a solid state relay circuit 110, or just "relay circuit".

The solid state relay circuit 110 may be embodied in an integrated circuit semiconductor chip (die) in one example. The solid state relay circuit 110 includes a solid state relay, which component is designated as a solid state relay switch 120, and further includes a solid state relay control circuit 130, used to control operation of the solid state relay switch 120.

The details of control of the solid state relay circuit 110 will be discussed with respect to the description to follow, and in particular with respect to the variant in FIG. 1B. In brief, the control of the solid state relay switch 120 will regulate the manner of maintaining sufficient charge in the capacitor C0 while optimizing the amount of time the solid state relay switch 120 is in an OFF state. According to embodiments of the disclosure, a first end of the solid state relay switch 120 is configured to couple to an external load line connected to the power source 102. The connecting line to couple the first end of the solid state relay switch 120 is shown as RLY2 This line is also coupled to the capacitor C0 via the diode D2. A second end of the solid state relay switch 120 is configured to couple to an external device shown as relay 104, via the line shown as RLY1, which line is also coupled to the capacitor C0 via the diode D3.

In operation, the capacitor C0 is used to power the various components of solid state relay circuit 110. When the solid state relay switch 120 is in an ON state, there will be essentially no voltage drop between RLY1 and RLY 2, and the voltage level of the capacitor C0 will slowly ramp down accordingly, due to any leakage or load current. As such, in order to preserve sufficient charge or voltage at the capacitor C0, according to the present embodiments, the solid state relay control circuit 130 acts to toggle the solid state relay switch 120 between an ON state and an OFF state based upon the voltage level of the capacitor C0, shown as Vcap. In particular, based upon the level of Vcap, the solid state relay control circuit 130 may send a control signal to the solid state relay switch 120 to alternately turn to an OFF state or turn to an ON state, in a fashion that maintains the solid state relay switch 120 in the ON state for an optimum amount of time while still ensuring that sufficient charge is maintained in the capacitor C0 to operate the solid state relay circuit 110 at all times.

In the example of FIG. 1A, the solid state relay switch 120 is formed of two transistors, shown as a first transistor M1 and a second transistor M2, where the control signal CS is fed to the transistor gates of the first transistor M1 and of the second transistor M2, so as to turn the two transistors into an ON state or into an OFF state in unison. The solid state relay switch 120 is arranged with a common source between the first transistor M1 and the second transistor M2, where the anode of a diode D0 and the anode of a diode D1 are coupled to the common source. Thus, the diode D0 and diode D1 rectify in opposite directions, so that the sold state relay switch 120 provides a bidirectional OFF state.

As shown in FIG. 1A, the solid state relay control circuit 130 is coupled between the charging capacitor C0 and the solid state relay switch 120. The solid state relay control circuit 130 may include a voltage detection circuit 132, having an input coupled to an output of the charging capacitor C0, and having an output arranged to generate a control voltage, such as a low voltage signal when a voltage level of the charging capacitor C0 is below a low threshold value. The voltage detection circuit may be arranged, for example, as a voltage divider having a plurality of resistors arranged in series. The voltage detection circuit 132 may also be arranged to generate a control voltage in the form of a high voltage signal when the voltage level of C0 is above a high threshold value, where the high threshold value is greater than the low threshold value. Thus, the voltage detection circuit 132 serves as a monitor as to the state of charge of the capacitor C0.

The solid state relay control circuit 130 may include a zero crossing circuit 134, coupled to the first relay line, RLY1 and the second relay line RLY2. As shown in FIG. 1A, the zero crossing circuit 134 may have an output to generate a clock signal when a zero crossing event takes place between the first relay line RLY1 and the second relay line RLY2. A zero-crossing event takes place when the potential difference between RLY1 and RLY2 is transitioning from a negative potential to a positive potential or transitioning from a positive potential to a negative potential. A zero crossing event thus corresponds to an instant where the potential is zero and occurs twice per cycle in an AC signal.

As shown in FIG. 1A, the solid state relay control circuit may further include a switch toggle circuit 136, having a plurality of inputs that are coupled to receive the clock signal from the zero crossing circuit 134 and the voltage level signal from the voltage detection circuit 132, respectively. In operation, when the voltage level of the capacitor C0 drops below a low threshold value, and after a low voltage signal is output in response, when a subsequent clock signal is generated, the switch toggle circuit 136 will output a signal so that the solid state relay switch 120 is changed from an ON state to an OFF state. In an example where the power source 102 generates an AC voltage in the range of several tens of Hertz, the net current between RLY1 and RL2 will cross zero many times every second. Thus, within typically several milliseconds after the voltage level on capacitor C0 drops below a low threshold value, the switch toggle circuit 136 will send a signal to turn off the solid state relay switch 120. Note that the electronics in the solid state relay control circuit may be such that the solid state relay switch 120 is turned off within less than one microsecond after a zero crossing event takes place. Thus, given a load current that varies sinusoidally at 60 Hz (— 16 msec period), for example, the load current will still be close to zero at the time that the solid state relay switch 120 is turned off.

In operation, as detailed further below, the solid state relay control circuit 130 may further set the solid state relay switch 120 to an ON state when a capacitor voltage of the charging capacitor, capacitor C0, is above a high threshold value. Thus, the solid state relay control circuit 130 will cycle the solid state relay switch 120 between an ON state and an OFF state, in a manner that timely places the solid state relay switch 120 in the OFF state in a safe manner, just when the voltage level of capacitor C0 is deemed to be too low, and just for a period sufficient to restore the voltage level of capacitor C0 to an acceptable level for control of the elements of solid state relay circuit 110.

Turning now to FIG. 1B there is shown another embodiment of a power control circuit 100A, operating generally according to the manner of operation of power control circuit 100, with like components labeled the same. In this embodiment, a solid state relay circuit 110B is provided, including a solid state relay control circuit 130B, arranged to control operation of the solid state relay switch 120. The solid state relay control circuit 130B includes a specific arrangement of components to both turn the solid state relay switch 120 to an OFF state when Vcap decreases below a low threshold value, and to return the solid state relay switch 120 to an ON state when Vcap increases to reach a high threshold value. In particular, the solid state relay control circuit 130B includes a specific the voltage detection circuit 132B, a zero crossing detector, shown as zero crossing circuit 134B, and a switch toggle circuit 136B. While the switch toggle circuit 136B shows a particular arrangement of components, other arrangement of comparators, flip-flops, logic gates, inverters, etc. are contemplated in order to perform these functions, as may be appreciated by those of ordinary skill in the art.

As shown in FIG. 1B, the power control circuit 100B includes the capacitor C0, diode D3 and diode D2, discussed above. The solid state relay circuit 110B may be embodied in an integrated circuit semiconductor chip in one example. In operation, the solid state relay switch 120 may be coupled to the external load line, the connecting line RLY1 and the connecting RLY2, as discussed above.

In operation, the capacitor C0 is used to power the various components of solid state relay circuit 110B. As with the embodiment of FIG. 1A, the solid state relay control circuit 130B acts to toggle the solid state relay switch 120 between an ON state and an OFF state based upon the voltage level of the capacitor C0, shown as Vcap. In particular, based upon the level of Vcap, the solid state relay control circuit 130B may send a control signal to the solid state relay switch 120 to alternately turn to an OFF state or turn to an ON state, in a fashion that maintains the solid state relay switch 120 in the ON state for an optimum amount of time while still ensuring that sufficient charge is maintained in the capacitor C0 to operate the solid state relay circuit 110B at all times.

To initiate operation of the power control circuit 100B and in particular the solid state relay circuit 110B, an enabling signal may be provided from an external source to a signal line in the solid state relay control circuit 130B. This signal line will provide an ENABLE HIGH signal to a first input B of an AND gate, shown as AND logic gate 17, included in the switch toggle circuit 136B. For example an enable signal may be received at the input B of AND logic gate 17 from an external circuit that is to turn on a heater whose operation is regulated by the power control circuit 100A. The AND logic gate 17 may have a second input, input A, to receive a logic signal that is generated from the solid state relay control circuit 130B, where this logic signal is shown as L3. In one example, when the AND logic gate 17 outputs a high signal the first transistor M1 and the second transistor M2 will be turned to an ON state. Thus, when the ENABLE signal goes high and is received at input B, and the logic signal L3 goes HIGH and is received at input A, the output of the AND logic gate 17 will turn ON or maintain in an ON state, the solid state relay switch 120.

Said differently, when the logic signal ENABLE is low, the output of the AND logic gate 17 is low, so that the control signal Q maintains first transistor M1 and second transistor M2 in an OFF state, and thus, the solid state relay switch 120 in an OFF state. In this state, the capacitor C0 will be charged via the diodes D0-D3 to a value represented by the peak voltage VO, provided by the power source 102 (which may be an AC source in this embodiment), minus two diode voltage drops corresponding to D2 and D3. An exemplary value according to one non-limiting embodiment for the peak voltage for capacitor C0 is 32V.

Note that the capacitor voltage is shown as Vcap, and is coupled to the solid state relay control circuit 130 via a voltage detection circuit 132B. While details are not shown, the voltage detection circuit 132B may operate as a voltage divider, so that the logic L1 will be output as HIGH or alternatively as LOW, depending upon the different levels of voltage detected. In some examples, the voltage detection circuit 132B may include a series of resistors. In the specific example shown, the voltage detection circuit 132B may be configured to output a true or logic HIGH value on L1 when the capacitor voltage Vcap is above 20 V, and to output a false of logic LOW value on L1 when the voltage Vcap is below 10V, with a resultant hysteresis of 10V. In other words, a logic LOW value that results in turning off the solid state relay switch 120 is not generated until Vcap drops below 10 V, while a logic HIGH value that results in restoring the solid state relay switch 120 to an ON state is not generated until Vcap increases to above 20 V.

In various embodiments, the voltage detection circuit 132B may include any suitable combination of components to output a signal based upon the level of voltage detected, including transistors, comparator, inverter, reference voltage source. In some embodiments, an Analog to Digital converter may be provided as well as logic in order to control the output on logic L1. Generally, the voltage levels for a high threshold, generating HIGH on L1, and a low threshold, generating LOW on L1, will be chosen based upon a minimum expected solenoid AC voltage (see relay 104), as well as the minimum operating voltage for the solid state relay circuit 110.

As further depicted in FIG. 1B, the switch toggle circuit 136B further includes an inverter 14, directly coupled to the output of the voltage detection circuit 132 and a Set/reset device, in this example, shown as a D-flipflop circuit 13. The D-flipflop circuit 13 may include a set input SN, coupled to an output side of the inverter 14, a D input, coupled to the output of the voltage detection circuit 132B; and a clock input, coupled to an output of the zero crossing circuit 134B.

As noted previously, the AND logic gate 17 includes a first input B to receive an external enabling signal, and a second input A. This second input is coupled to an output of the D-flipflop circuit 13. Thus, when the ENABLE signal received at the first input is high, depending upon the level of the signal generated by the D-flipflop circuit 13, the AND logic gate 17 will either output a signal to turn the solid state relay switch OFF or ON.

In turn, the D-flipflop circuit 13, and the solid state relay control circuit 130, will be controlled in the following manner. When the voltage Vcap is above 20V, L1 will be high, and the signal L2, after L1 is inverted by inverter 14, will be low. The low signal on L2 will force the D-flipflop circuit to output a high signal of L3 to AND logic gate 17. When the ENABLE signal received by logic AND gate is also high, then AND logic gate 17 will output on L4 a high signal to turn on the solid state relay switch 120.

Note that in other embodiments, the D-flipflop circuit 13 may be replaced by an S/R flip flop, which circuit may be constructed from a pair of NAND gates or NOR gates, as known in the art. A pulse on SET would make the output true and a pulse on the RESET would make the output go false. If L1 is true this condition could SET the circuit, and if L1 is false AND clock is true this condition could reset the circuit.

During the period when the solid state relay switch 120 is in an ON state, the voltage between RLY1 and RLY2 will be reduced to the millivolt range. This change will result in a slow decay of voltage for Vcap, as leakage current or other current is drained from the capacitor C0. As noted previously, when the voltage detection circuit 132B detects that voltage level of Vcap has dropped below a low threshold value, such as 10V, the resulting logic low value of L1 will drive L2 high, which signal is received at SN input of D-flipflop circuit 13. By itself, this L2 high signal will not change the state of the D-flipflop circuit 13. However, when the zero crossing circuit 134B detects a crossing of the signal between RLY1 and RLY2, the zero crossing circuit 134B will output a short pulse signal shown as CLK, which pulse signal is received at the clock input of the D-flipflop circuit 13. Upon receipt of the CLK signal, the D-flip flop circuit 13 will clock the state of L1 into the flip-flop, changing the output L3 state to low level, which output, upon receipt by the AND logic gate 17, will cause the logic AND gate to generate a low signal on L4, turning the solid state relay switch 120 to an OFF state, during which state, the voltage from load 102 will charge the capacitor C0, until the voltage Vcap exceeds 20 V.

Once the voltage detection circuit determines that Vcap again exceeds 20V, the series of operations outlined previously will be performed, resulting in the turning ON once more of solid state relay switch 120. Note that, during the cycling of the solid state relay switch 120 between ON and OFF states, the duration of the ON state may be much longer than the duration of the OFF state, since the capacitor C0 may be rapidly charged while in the OFF state, while during the ON state, the decay in capacitor voltage from above 20V to below 10V may be relatively slower.

Figure 1C:
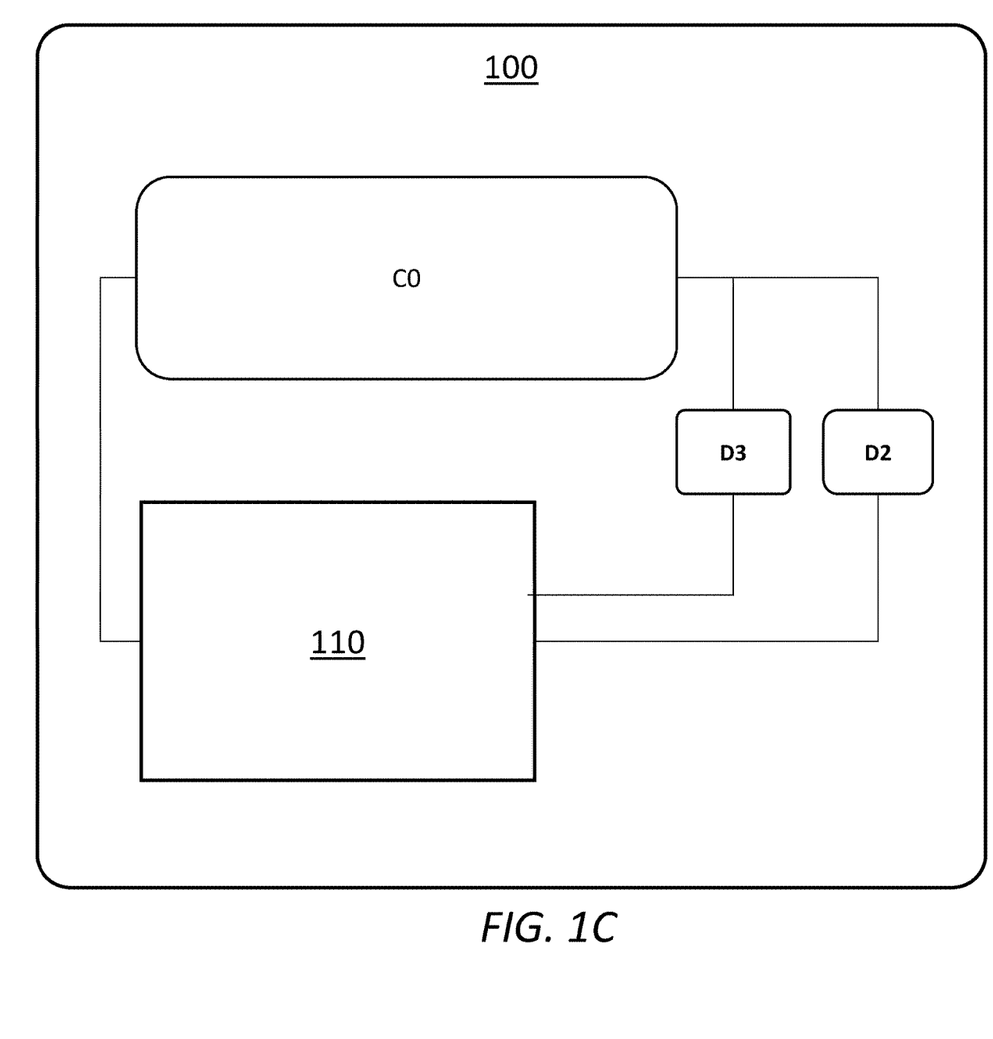
FIG. 1C illustrates a top view of the power control circuit of FIG. 1A or FIG. 1B.

FIG. 1C illustrates a top view of an embodiment of the power control circuit of FIG. 1A or FIG. 1B. In this example, the solid state relay circuit 110 is arranged in a semiconductor die, while the charging capacitor C0, the diode D2 and the diode D3 are disposed externally to the semiconductor die. In the arrangement shown in FIG. 1C, the diode D0 and diode D1 may be body diodes of respective transistors M1 and M2 of the solid state relay switch 120, and thus formed in a semiconductor die containing the solid state relay circuit 110. In other examples, diodes D0 and D1 may be formed separately from the transistors M1 and M2, either on chip or off chip. In some embodiments of body diodes, the diode D0 and diode D1 may be incorporated into a semiconductor chip substrate in a manner that includes a junction isolation region to isolate the body diodes from the substrate in order to avoid noise currents that may otherwise by injected.

Figure 1D:
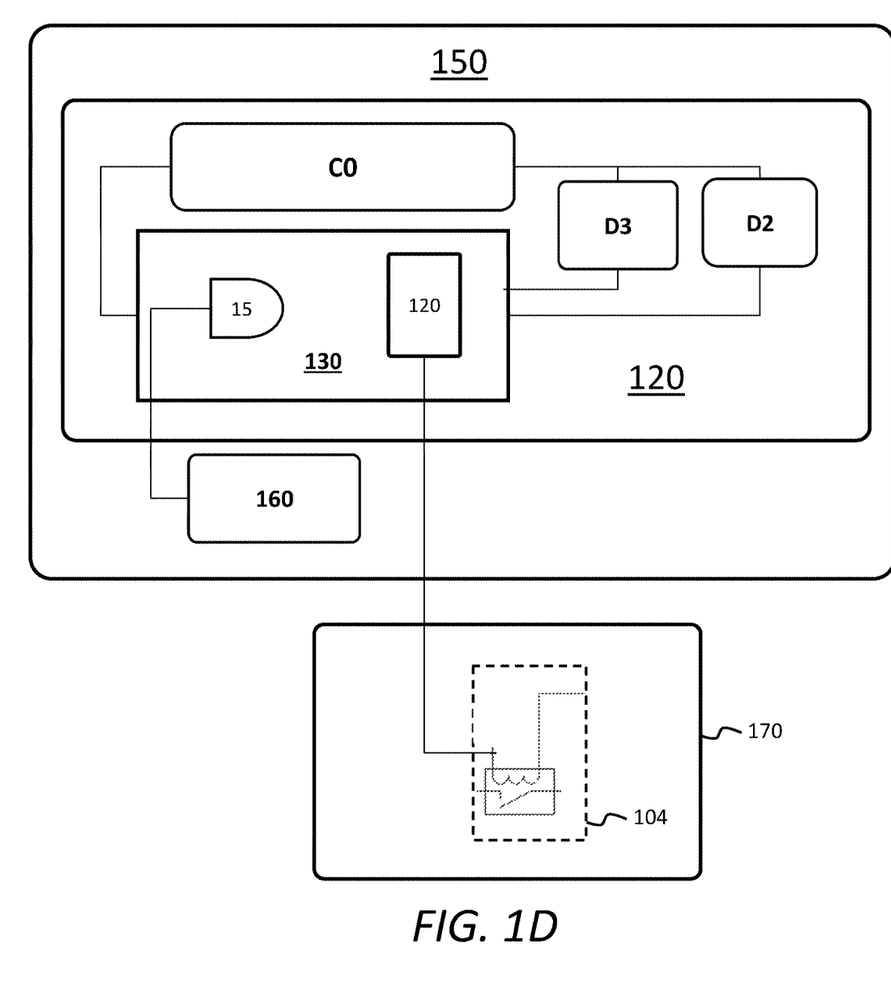
FIG. 1D illustrates one use scenario for the embodiment of the power control circuit of FIG. 1A or FIG. 1B.

FIG. 1D illustrates one use scenario for the power control circuit of FIG. 1A or FIG. 1B. In this example, a thermostat device 150 is shown, where the thermostat device 150 is arranged to control operation of an utility device 170, such as a furnace unit or air conditioning unit. The relay 104 may be located within the utility device 170, to switch, for example, AC power form an AC source (not shown) on and off through the utility device 170. The thermostat device 150 further includes a sensor 160, coupled to alternatively provide an enable HIGH signal or and enable LOW signal to the AND logic circuit 15, described previously, depending upon the ambient temperature detected.

Figure 2:
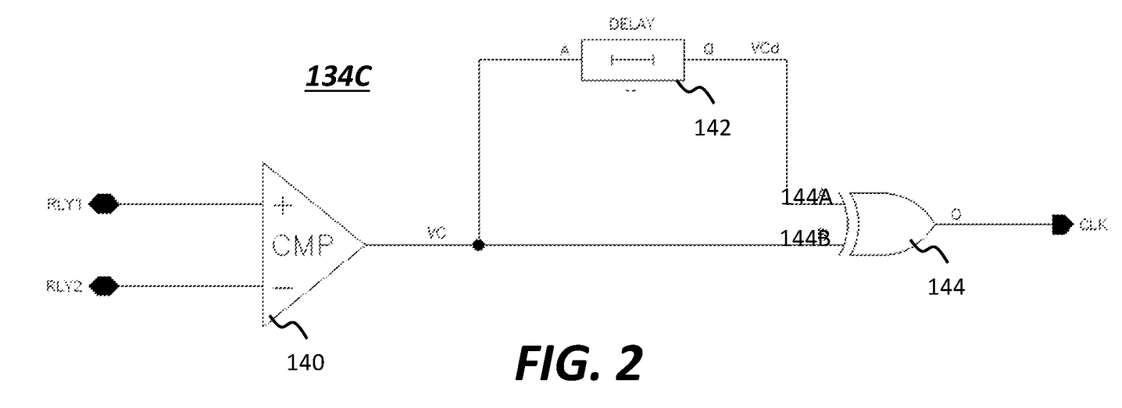
FIG. 2 illustrates an embodiment of a zero crossing detection circuit.

FIG. 2 illustrates an embodiment of a zero crossing detection circuit 134C. This circuit includes a comparator 140, arranged with a first input, coupled to RLY1, and a second input, coupled to RLY2. An output of the comparator is coupled to an input of a delay circuit, referred to herein as a delay element 142, and an input 144B of an exclusive OR gate 144. A output of the delay element 142 is coupled to an input 144A of the exclusive OR gate 144. In operation, when the comparator 140 detects a crossing in the current signals of RLY1 goes above or below the current signal of RLY2, the comparator 140 changes the logic level, which change is shown as signal VC that is output to the exclusive OR gate 144. The delay element 142 receives the signal VC and generates a delayed version of VC, shown as VCD, which signal is received at the exclusive OR gate 144. The exclusive OR gate generates a logic high pulse when the logic level input received at input 144B is different from the logic level received at the input 144A. Thus, if RLY1 is higher than RLY2, VC will be TRUE. If RLY1 is lower than RLY2, VC will be false. Thus, each zero crossing causes VC to change logic levels. VCD stays at the old logic level for a delay period, therefor VCD is always the logical opposite of the VC signal for the delay period when VC changes levels. In this manner, the exclusive OR gate generates a short true pule corresponding to the length of the delay for each zero crossing event.

Figure 3:
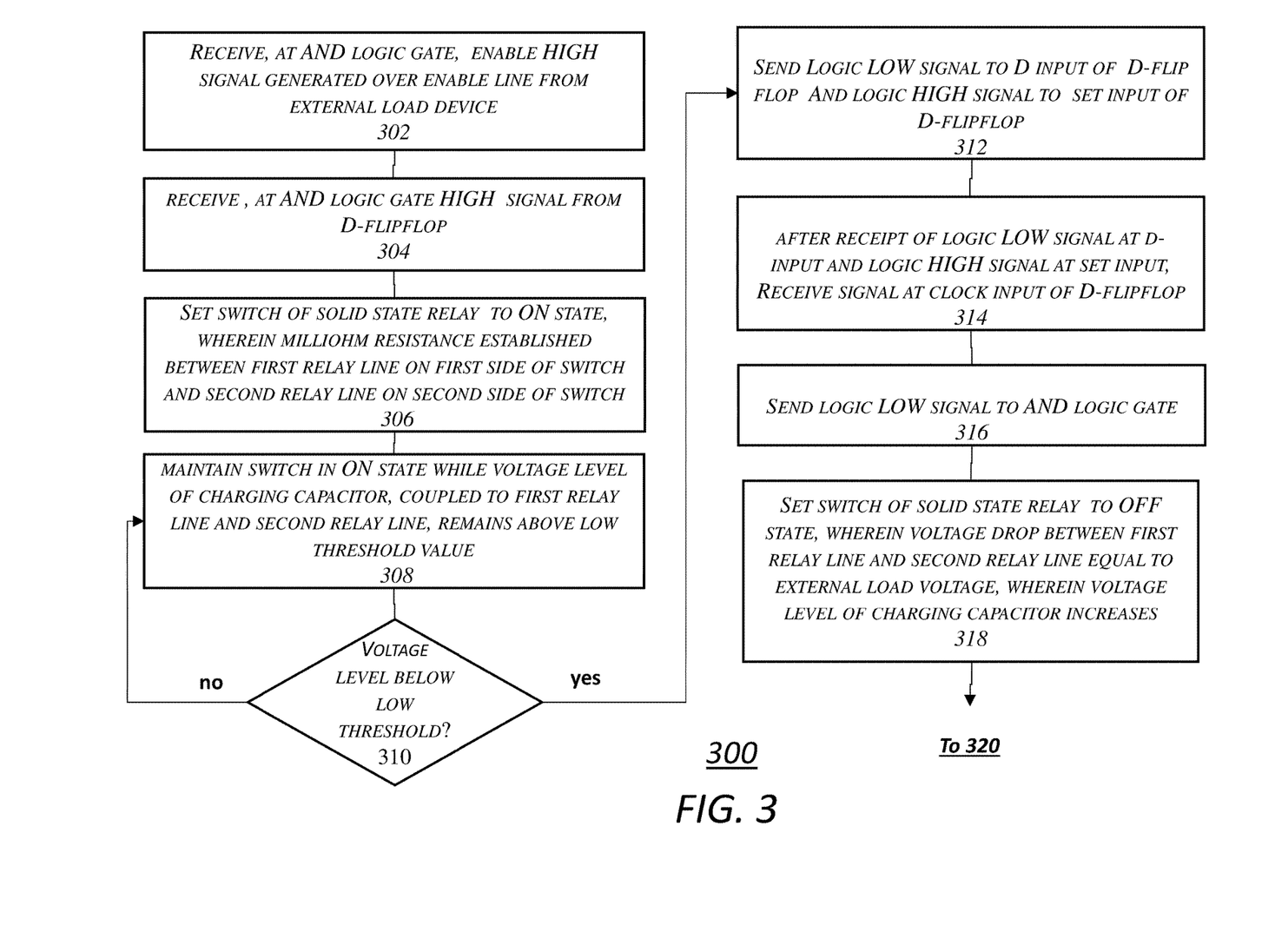
FIG. 3 illustrates an embodiment of a process flow.

FIG. 3 illustrates an embodiment of a process flow 300. At block 302, an enable HIGH signal generated over an enable line from an external device is received at an AND logic gate of a solid state relay switch control circuit of a solid state relay.

At block 304, a logic HIGH signal is received at the AND logic gate from a D-flipflop of the solid state relay switch control circuit. At block 306, a solid state relay switch of the solid state relay is set to an ON state by an output from the AND logic gate, where a low resistance on the order of milliohm resistance is established between a first relay line on a first side of the switch and a second relay line on a second side of the switch. At block 308 the switch is maintained in the ON state while a voltage level of a charging capacitor, coupled to first relay line and the second relay line, remains above a low threshold value.

At decision block 310, a determination is made as to whether the voltage level of the charging capacitor is below the low threshold value. If not, the flow returns to block 308. If so, the flow moves to block 312. At block 312, a Logic LOW signal is sent to a D input of a D-flip flop and a logic HIGH signal is sent to a set input of the D-flipflop.

At block 314, after receipt of the logic LOW signal at the D-input and receipt of the logic HIGH signal at the set input, a clocking signal is received at a clock input of the D-flip-flop. At block 316 a logic LOW signal is sent to an AND logic gate.

At block 318, the switch of the solid state relay is set to an OFF state, wherein a voltage drop between the first relay line and the second relay line is equal to the external load voltage. The flow then proceeds to decision block 320.

At decision block 320, a determination is made as to whether the voltage level on the charging capacitor has exceeded a high threshold value. If not the flow returns to block 318. If so, the flow proceeds to decision block 322.

At decision block 322 if an enable HIGH signal is still present over the enable the flow proceeds on to block 324 or ends if the HIGH signal is no longer present.

At block 324, logic HIGH signal is sent to the D input of D-flip flop and a logic LOW signal is sent to the set input of the D-flipflop At block 326 a logic HIGH signal is sent from the D-flipflop to the AND logic gate, whereupon the flow returns to block 306.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A relay circuit, comprising:
a solid state relay switch, connected to a first relay line for coupling to an external voltage line and to a charging capacitor, and connected to a second relay line for coupling to an external device; and
a solid state relay control circuit, coupled between the charging capacitor and the solid state relay switch, the solid state relay control circuit comprising:
a voltage detection circuit, having an input coupled to an output of the charging capacitor, and having an output arranged to generate a LOW voltage signal when a voltage level of the charging capacitor is below a low threshold value; and
a zero crossing circuit, coupled to the first relay line and the second relay line, and having an output to generate a clock signal when a zero crossing event takes place between the first relay line and the second relay line.

2. The relay circuit of claim 1, the voltage detection circuit arranged to generate a HIGH voltage signal when the voltage level is above a high threshold value, wherein the high threshold value is greater than the low threshold value.

3. The relay circuit of claim 2, wherein the voltage detection circuit comprises a voltage divider having a plurality of resistors arranged in series.

4. The relay circuit of claim 1, the solid state relay control circuit further comprising a switch toggle circuit, having a plurality of inputs that are coupled to receive the clock signal and the LOW voltage signal, respectively, wherein after the LOW voltage signal is output, when the clock signal generated, the solid state relay switch is changed from an ON state to an OFF state.

5. The relay circuit of claim 4,
wherein the switch toggle circuit further comprises:
an inverter, coupled to the output of the voltage detection circuit; and
a D-flipflop circuit, comprising:
a set input, coupled to an output side of the inverter;
a D input, coupled to the output of the voltage detection circuit; and
a clock input, coupled to an output of the zero crossing circuit.

6. The relay circuit of claim 5, wherein the solid state relay control circuit further comprising:
an AND logic gate, comprising:
a first input to receive an external enabling signal;
a second input coupled to an output of the Dflipflop circuit; and
an output, coupled to the solid state relay switch.

7. The relay circuit of claim 6, wherein the solid state relay switch comprises a pair of transistors, wherein a first transistor gate of a first transistor of the solid state relay switch, and a second transistor gate of a second transistor of the solid state relay switch are coupled to an output of the AND logic gate.

8. The relay circuit of claim 1, wherein the zero crossing circuit comprises:
a comparator, having a first input coupled to the first relay line and a second input coupled to the second relay line;
a delay circuit, having an input coupled to an output of the comparator; and
an exclusive OR logic gate having a first input, coupled to an output of the delay circuit, and a second input, coupled to the output of the comparator.

9. A method, comprising:
providing a solid state relay switch having a first end coupled via a first relay line to a charging capacitor and to an external device line, and having a second end coupled over a second relay line to the charging capacitor and to an external load line;
receiving at the solid state relay switch, an ON signal based upon an enable high signal generated over an enable line from an external load device;
setting the solid state relay switch to an ON state when a capacitor voltage of the charging capacitor is above a high threshold value; and
when the capacitor voltage falls below a low threshold value,
setting the solid state relay switch to an OFF state in response to receipt of a clock signal from a zero crossing circuit that is coupled to the first relay line and the second relay line.

10. The method of claim 9, wherein the solid state relay switch comprises a first transistor and a second transistor, wherein when an enable LOW signal is received in the solid state relay, the first transistor and the second transistor are maintained in an OFF state, and wherein the charging capacitor is coupled to receive a charging voltage from the external load device.

11. The method of claim 9 wherein, in the ON state a voltage drop between the first relay line and the second relay line, is between several millivolts and hundreds of millivolts.

12. The method of claim 9, wherein during the ON state, a capacitor voltage at the charging capacitor decreases over time, wherein at a second instance during the ON state, the capacitor voltage drops below the low threshold value.

13. The method of claim 9, wherein the setting the solid state relay switch to an ON state comprises:

sending a logic high signal from a voltage detection circuit coupled to the charging capacitor, to a D-flipflop circuit;

directing a HIGH signal from the D-flipflop circuit to an AND logic gate, responsive to receipt of the logic HIGH signal; and sending a HIGH control signal from the AND logic gate to turn on a set of transistors in the solid state relay switch.

14. The method of claim 13, wherein the setting the solid state relay switch to an OFF state comprises:

detecting a zero crossing event between the first relay line and second relay line at a comparator of the zero crossing circuit;

directing the clock signal from the zero crossing circuit to the D-flipflop circuit, at an instance after a logic LOW signal is received from the voltage detection circuit;

directing a LOW signal from the D-flipflop circuit to the AND logic gate, responsive to receipt of the clock signal; and responsive to receipt of the LOW signal, sending a LOW control signal from the AND logic gate to turn off the set of transistors in the solid state relay switch.

* * * * *